(12) United States Patent
North et al.

(10) Patent No.: US 12,457,703 B2
(45) Date of Patent: Oct. 28, 2025

(54) METHOD AND APPARATUS FOR A MOBILE INFORMATION HANDLING SYSTEM WITH AN ION DRAG BLOWER INTEGRATED WITH A FAN FOR ENHANCED CONVECTION AIRFLOW

(71) Applicant: Dell Products, LP, Round Rock, TX (US)

(72) Inventors: Travis C. North, Cedar Park, TX (US); Qinghong He, Austin, TX (US); Mitchell Anthony Markow, Hutto, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 234 days.

(21) Appl. No.: 17/974,036

(22) Filed: Oct. 26, 2022

(65) Prior Publication Data
US 2024/0147657 A1    May 2, 2024

(51) Int. Cl.
*H05K 7/20*    (2006.01)

(52) U.S. Cl.
CPC ..... *H05K 7/20172* (2013.01); *H05K 7/20145* (2013.01); *H05K 7/20409* (2013.01)

(58) Field of Classification Search
CPC ........... H05K 7/20172; H05K 7/20145; H05K 7/20409
See application file for complete search history.

(56) References Cited

U.S. PATENT DOCUMENTS

| | | | |
|---|---|---|---|
| 7,545,640 B2 | 6/2009 | Fisher | |
| 8,467,168 B2 | 6/2013 | Honer | |
| 8,508,908 B2 | 8/2013 | Jewell-Larsen | |
| 2005/0063130 A1 | 3/2005 | Francis | |
| 2005/0214180 A1 | 9/2005 | Joannou | |
| 2010/0037886 A1 | 2/2010 | Krichtafavovitch | |
| 2010/0051709 A1 | 3/2010 | Krichtafavovitch | |
| 2011/0036552 A1 | 2/2011 | Lu | |
| 2011/0261499 A1 | 10/2011 | Hizer | |

(Continued)

FOREIGN PATENT DOCUMENTS

| | | |
|---|---|---|
| WO | 2007/112763 A1 | 10/2007 |
| WO | 2009/131980 A2 | 10/2009 |

(Continued)

*Primary Examiner* — Mukundbhai G Patel
(74) *Attorney, Agent, or Firm* — ProI Intellectual Property Law, PLLC; H. Kenneth ProI

(57) ABSTRACT

An information handling system includes a powered hardware processor and a memory device. The information handling system includes an ion emitter/collector blower cooling system including an ion emitter/collector blower having an ion emitter and an ion collector, the ion emitter/collector blower being operatively coupled to a fan and located between the fan and an exhaust vent formed in a top edge of the chassis of the information handling system. An ionic driving circuit is operatively coupled to the ion emitter via a high voltage to ionize gases at the ion emitter/collector blower to create charged ions that generate an airflow to and through the ion collector. The information handling system also includes an air intake vent located at the fan in the chassis so that the airflow is brought into the chassis via the fan, through the fan and ion emitter/collector blower, and out of the air exhaust vent.

20 Claims, 5 Drawing Sheets

(56) References Cited

U.S. PATENT DOCUMENTS

| | | |
|---|---|---|
| 2011/0292593 A1 | 12/2011 | June |
| 2012/0007742 A1 | 1/2012 | Gooch |
| 2012/0008248 A1 | 1/2012 | Sawyer |
| 2012/0048529 A1 | 3/2012 | June |
| 2012/0057356 A1 | 3/2012 | Hizer |
| 2012/0205079 A1* | 8/2012 | Jewell-Larsen .... H05K 7/20172 165/104.34 |
| 2012/0268857 A1 | 10/2012 | Jewell-Larsen |
| 2013/0021715 A1 | 1/2013 | Jewell-Larsen |
| 2013/0340981 A1* | 12/2013 | Jewell-Larsen ........ B01D 71/04 29/592.1 |
| 2016/0202733 A1* | 7/2016 | Ho ........................ G06F 1/1667 361/679.12 |
| 2016/0265856 A1 | 9/2016 | Saveliev |
| 2017/0354225 A1 | 12/2017 | Brickner |

FOREIGN PATENT DOCUMENTS

| | | |
|---|---|---|
| WO | 2011/149667 A1 | 12/2011 |
| WO | 2012/006361 A2 | 1/2012 |

\* cited by examiner

METHOD AND APPARATUS FOR A MOBILE INFORMATION HANDLING SYSTEM WITH AN ION DRAG BLOWER INTEGRATED WITH A FAN FOR ENHANCED CONVECTION AIRFLOW

FIELD OF THE DISCLOSURE

The present disclosure generally relates to cooling systems for information handling system. The present disclosure more specifically relates to an ion emitter/collector blower cooling system used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a hardware processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
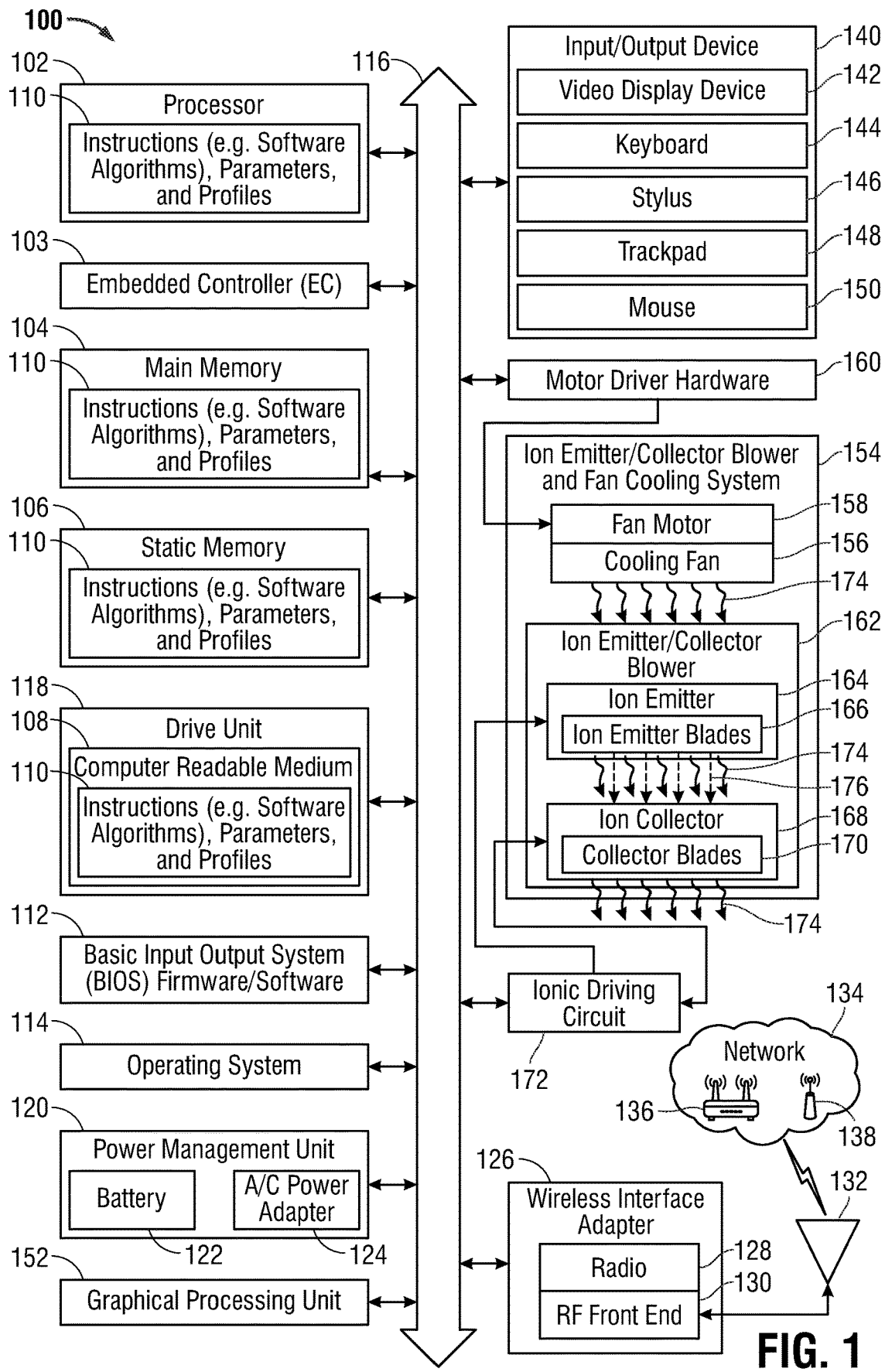
FIG. 1 is a block diagram of an information handling system including an ion emitter/collector blower cooling system with an ion emitter/collector blower and cooling fan according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a cooling fan used to blow heat from within the housing to a vent to vent the heated air from within the housing. However, these fans may create a higher degree of noise that may interfere with the use of the information handling system especially when the fan speed is increased due to increased power consumption and a resulting increase in temperature within the housing.

The present specification describes an information handling system that includes processor, a memory device, and a power management unit (PMU) to provide power to the processor and memory device. The information handling system further includes a cooling fan and fan motor operatively coupled to a motor driver hardware operated by the hardware processor. In an embodiment, the fan may be placed in series with an ion emitter/collector blower cooling system. The ion emitter/collector blower cooling system includes an ion emitter/collector blower, the ion emitter/collector blower including an ion emitter and an ion collector, the ion emitter/collector blower being placed at a location within a chassis of the information handling system vertically higher than the cooling fan and between the fan and an exhaust vent formed in a top edge of the housing of the information handling system. The ion emitter/collector blower cooling system is operatively coupled to an ionic driving circuit operatively coupled to the ion emitter via a high voltage to ionize gases at the ion emitter/collector blower to create charged ions that generate an airflow along a voltage field to and through the ion collector. The housing of the information handling system includes an air intake vent located at the cooling fan and formed in a back surface of the chassis of the information handling system so that the airflow is brought into the chassis of the information handling system via the fan, through the fan and ion emitter/collector blower, and out of the air exhaust vent.

In an embodiment, the ion collector provides a deionization source for the ionized gases formed by the ion emitter the ion collector including one or more separated collector blades through which the airflow may pass. In an embodiment, the separated blades of the ion collector operate as thermal fins to dissipate heat conducted from a passive heat conducting device. In an embodiment, the passive heat conducting device may include a heat pipe, a vapor chamber, or other type of passive device that can conduct heat from the heat-generating devices in the housing of the information handling system to the separated blades of the ion collector.

In an embodiment, the ion emitter includes a plurality of ion emitter blades operatively coupled to the ionic driving circuit, the ionic driving circuit including a high-voltage electrical source to strip electrons from gas molecules via the high voltage at edges of the blades of the ion emitter. In an embodiment, the ion emitter includes a plurality of ion emitter blades operatively coupled to a passive heat conducting device to conduct heat into the ion emitter blades and, via convection, dissipate heat into the airflow.

In an embodiment, airflow through the chassis of the information handling system by the cooling fan and ion emitter/collector blower system is supplemented using a buoyancy of air heated inside of the chassis of the information handling system toward the upper exhaust vent location in the chassis of the information handling system in a vertical orientation. This chimney effect allows for relatively more heat to be exhausted through the exhaust vent formed in the top edge of the housing of the information handling system.

FIG. 1 illustrates an information handling system 100 similar to information handling systems according to several aspects of the present disclosure that is operatively couplable to an ion emitter/collector blower and fan cooling system 154 formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a two-in-one computer, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing, via a hardware processing resource, a set of machine-readable code instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of machine-readable code instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU) or other hardware processor 102, an embedded controller (EC) 103, a graphics processing unit (GPU) 152, hardware processing device, hardware controller, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the hardware devices or hardware processing resources to execute machine-readable code instructions for the one or more systems and modules described above, and operates to perform one or more of the methods described herein. For example, machine-readable code instructions may be executed by the EC 103, a PMU controller, or other hardware processing resource for an ion emitter/collector blower and fan cooling system 154 to control the ion emitter/collector blower 162 and cooling fan 156 of embodiments herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a hardware processor 102, a central processing unit (CPU), accelerated processing unit (APU), a neural processing unit (NPU), a vision processing unit (VPU), an EC 103, a digital signal processor (DSP), a GPU 152, a microcontroller, or any other type of hardware processing device that executes machine-readable code instructions to perform the processes described herein. Any of the hardware processing resources may operate to execute code that is either firmware or software code. Moreover, the information handling system 100 can include memory such as main memory 104, static memory 106, computer readable medium 108 storing machine-readable code instructions 110 of, in an example embodiment, an ion emitter/collector blower and fan cooling system 154 (e.g., controlled by a power management unit (PMU) hardware controller hardware processor 102, or an EC 103), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to an ion emitter/collector blower and fan cooling system 154. The ion emitter/collector blower and fan cooling system 154 may be coupled within a housing of the information handling system 100 in an embodiment so that heat generated by the operation of the heat-generating hardware (e.g., hardware processor 102, memory devices 104, 106, PMU 120, CPU, etc.) may be directed out of the housing of the information handling system 100 via an air exhaust vent formed in the housing (e.g., at a top side surface of the housing of the information handling system 100). The ion emitter/collector blower and fan cooling system 154 may include an ion emitter/collector blower 162 that may, in an example embodiment, include a housing used to house the components of the ion emitter/collector blower 162 described herein in an embodiment. In an alternative embodiment, the ion emitter/collector blower 162 does not include a housing and instead, those components of the ion emitter/collector blower and fan cooling system 154 are operatively coupled to an interior surface of the housing of the information handling system 100. For ease of discussion, the ion emitter/collector blower 162 of the ion emitter/collector blower and fan cooling system 154 will be described as including a housing which allows the ion emitter/collector blower 162 to be modular and replaced if necessary.

The ion emitter/collector blower 162 of the ion emitter/collector blower and fan cooling system 154 includes an ion emitter 164. In an embodiment, the ion emitter 164 includes a plurality of ion emitter blades 166 through which air may pass and which are used to create an airflow into, through, and out of the ion emitter/collector blower 162. The number of ion emitter blades 166 may vary depending on an anticipated level of heat generation by the hardware components within the information handling system 100, and the shape and design of the housing of the ion emitter/collector blower 162, or housing of the information handling system 100, among other factors. Each of the ion emitter blades 166 are coupled to an electrode of a high voltage source of an ionic driving circuit 172. In an embodiment, each of the ion emitter blades 166 includes a blade edge. In one embodiment, the blade edges may be made to come to a sharp point in order to facilitate the creation of more ions 172 than would otherwise be created from a flat or non-sharped edge. In an embodiment, the ion emitter/collector blower 162 and the ion emitter blades 166 may be made of a refractory metal such as niobium, chromium, molybdenum, tantalum, tungsten, and rhenium among others. In an embodiment, the portions of the ion emitter/collector blower 162 and ion emitter blades 166 may be electroplated with a refractory metal such as niobium, chromium, molybdenum, tantalum, tungsten, and rhenium among others with an interior layer of the ion emitter blades 166 being made of a conductive material such as iron. It is appreciated that the ion emitter blades 166 may be made of any alloy of metal that includes alloys of those refractory metals described herein.

The ion emitter/collector blower 162 also includes an ion collector 168. In an embodiment, the ion collector 168 includes a plurality of ion collector blades 170 through which air may pass and which are used to deionize those ions 176 created at the ion emitter 164 as described herein. The number of ion collector blades 170 may vary depending on an anticipated level of heat generation by the hardware components within the information handling system 100 and the shape and design of the housing of the ion emitter/collector blower 162, or the housing of the information handling system 100, among other factors such as the creation of ions 176 at the ion emitter 164. Each of the ion collector blades 170 are coupled to an electrode of a high voltage source of an ionic driving circuit 172 in an embodiment. In an embodiment, the ion collector blades 170 are coupled to a grounding source used to prevent arcing between the ion emitter 164 and ion collector 168. In an embodiment, each of the ion collector blades 170 includes a blade edge. It is appreciated that the ion collector blades 170 may be made of any alloy of metal that includes alloys of those refractory metals described herein.

As described herein, the ion emitter 164 and its ion emitter blades 166 as well as the ion collector 168 and its ion collector blades 170 are electrically coupled to a high voltage source (e.g., 2 kV to 10 kV voltage source difference between the ion emitter 164 and the ion collector 168). In an embodiment, the ionic driving circuit 172 may include a boost converter that provides, for the high voltage source of the ionic driving circuit 172, those voltages described herein to the ion emitter 164 and ion collector 168.

As described in embodiments herein, the ion emitter 164 of the ion emitter/collector blower 162 may be operatively coupled to an ionic driving circuit 172. In an embodiment, the ionic driving circuit 172 is controlled via the hardware processor 102, the PMU 120 with a hardware controller, an EC 103, or the like. The ionic driving circuit 172, in an embodiment, includes a high voltage source that is operatively coupled to ion emitter/collector blower 162. In an embodiment, the high voltage source may include a boost converter that steps up voltage from its input (e.g., a battery 122 or A/C power adapter 124) to the output at the ion emitter 164 and/or the ion collector 168 of the ion emitter/collector blower 162. The high voltage source of the ionic driving circuit 172 causes the ion emitter 164 to emit ions 176 from the edges of each ion emitter blades 166. In the context of the present specification, the term "emit", or "emitter" is meant to describe an action and device that, at its edges or other surfaces, creates ions 176 and, via an electromagnetic repulsion, repels those ions 176 towards an attracting, oppositely charged source such as the ion collector 168 described herein. In an embodiment, the high voltage source of the ionic driving circuit 172 causes electrons to be ripped away from certain molecules such as gas molecules in the atmosphere thereby creating ions 176 (e.g., positively-charged ions 176) at the edges or other surfaces of the ion emitter blades 166. This ionization process may include the removal of one or more electrons from the outer valence shells of the individual molecules within the gas such that they become positively charged (e.g., cations) in an embodiment. In an example where the interior of the housing of the ion emitter/collector blower 162 includes atmospheric air, any number of types of gas molecules may be subjected to this process. For example, where the gas includes oxygen ($O_2$), the ionization of oxygen may include the removal of a single electron or two electrons from the oxygen molecule. This may lead to a $O_2^+$ or $O_2^{2+}$ ion (e.g., cation molecules or individual atoms) being created by the ion emitter/collector blower 162 and ionic driving circuit 172 in an embodiment. Other gas molecules or molecules within the atmosphere within the ion emitter/collector blower 162 may similarly be ionized such as nitrogen, carbon dioxide, argon, hydrogen, etc. to create other ions 172 such as $N^{+1}$, $N^{+2}$, $N^{+3}$, $N^{+4}$, $N^{+5}$, $O_3$ (ozone), $H^{+1}$.

This ionization of the atmospheric gases within ion emitter/collector blower 162 helps to cause an airflow 174 into, within, and out of the ion emitter/collector blower 162. In an embodiment, the movement of the ions 176 from the ion emitter 164 to the ion collector 168 creates a shearing force on the air (e.g., ionized molecules drag non-ionized molecules) within the ion emitter/collector blower 162. This shearing force pulls the other air molecules in the direction of the magnetic pull of the ions 172 created by the ion emitter 164 towards the ion collector 168 thereby creating this airflow 174. In an embodiment, the movement of the ions 176 created and emitted from the ion emitter 164 may be from the ion emitter 164 to the ion collector 168. In an example embodiment, the ion emitter 164 may each be operatively coupled to a positive electrode of the high voltage source of the ionic driving circuit 172. As a result of generating the positively charged ions 176, the charged ion emitter 164 now repels those positively charged ions 176 causing the charged ions 176 to be repelled away from the ion emitter 164, following the electric field created between the ion emitter 164 and ion collector 168, and attracted to the ion collector 168.

In an embodiment, the ion collectors 160, 166 are each operatively coupled to a negative or opposite electrode of the high voltage source of the ionic driving circuit 172. In an embodiment, the ion collector 168 are operatively coupled to a grounding source or high voltage negative source of the ionic driving circuit 172. Whether the ion collector 168 is operatively coupled to a negative electrode of the high voltage source or to ground of the high voltage source of the ionic driving circuit 172, the voltage difference between the ion emitter 164 and the ion collector 168 determines an electric field between ion emitter 164 and the ion collector 168. The ions 176 created by the ion emitter 164 follow this electric field. In an embodiment where the ion collector 168 is operatively coupled to a negative electrode of the high voltage source and not ground, the ion collector 168 may be electrically insulated from the remaining portions of the ion emitter/collector blower 162 and its housing. In an embodiment, this electrical isolation may be accomplished by making the housing of the ion emitter/collector blower 162 out of an electrically non-conductive material such as plastic. In an embodiment, the electrical isolation may be accomplished by placing an insulative gasket between the ion collector 168 and a housing of the ion emitter/collector blower 162 and the ion emitter 164. The electrical isolation of the ion collector 168 allows for the electrical field between the ion emitter 164 and ion collector 168 to be formed allowing for an electrical field path for the ions 176 to follow.

In an embodiment, the creation of the electric field between the ion emitter 164 and ion collector 168 causes the positively-charged ions 176 created by the ion emitter 164 to be attracted to the negatively charged ion collector 168 further causing movement of the ions 176 and creating the airflow 174 described herein. As the positively-charged ions 176 reach the ion collector 168, those missing valence electrons stripped away by the ion emitter 164 at the ions 172 may be added to a valence shell of the ionized molecules placing those gases at a neutral electrical charge again. Following the example of the ionization of the oxygen molecules in the atmospheric gases within the ion emitter/collector blower 162 by the ion emitter 164, as these $O_2^+$ or $O_2^{2+}$ ions 176 (e.g., cations) have their extraneous electrons returned from at their valence electron shells (e.g., a single electron or two electrons, respectively) the oxygen molecules are placed in an electrically neutral state.

In an embodiment, the creation of this airflow 174, via the operation of the ion emitter/collector blower 162 and ionic movement of the ions 176 created by the ion emitter 164, has a low-pressure head of around 0.04 to 0.05 inches of $H_2O$ (water column) as compared to the rotation of a fan (e.g., fan 156) or another type of blower that may have a pressure head of around 0.5 inches of $H_2O$. However, the flow rate of air into and out of the ion emitter/collector blower 162 via operation of the ion emitter 164 creating ions 176 plus a fan 156 is relatively higher than the potential flow rate of air created by the rotation of the fan 156 alone. For purposes of the present specification, the term "pressure head" is defined as the height of a fluid (e.g., air, water or other fluids) column that corresponds to a particular pressure exerted by the fluid column corresponding to pressure or psi of airflow created by the ionization of air. With a relatively high airflow rate but lower pressure head, the acoustics of the ion emitter/collector blower 162 are lower than a fan and almost silent in an embodiment.

As described herein, the airflow 174 created by the ion emitter/collector blower 162 may be supplemented by an airflow generated by the operation of a fan 156. In an embodiment, the fan 156 may be placed upstream or at an air intake of the ion emitter/collector blower 162 so that air may pass through a housing of the fan 156, enter the ion emitter/collector blower 162, and be accelerated through the housing of the ion emitter/collector blower 162 and out of the ion emitter/collector blower 162. This series arrangement of the fan 156 to the ion emitter/collector blower 162 allows for the selective activation of the fan 156, the ion emitter/collector blower 162, or both based on, for example, a temperature detected within the chassis of the information handling system 100, specific hardware devices within the housing, or a combination of hardware devices within the housing of the information handling system 100. In an alternative embodiment, the power consumed by one or more hardware devices within the information handling system 100 may indicate if and when the fan 156, the ion emitter/collector blower 162, or both are activated to create an airflow through the housing of the information handling system 100.

The fan 156 may be placed within a fan housing in an embodiment. The fan 156 may be rotated by a fan motor 158 and motor driver hardware 160 as instructed by the hardware processor 102. In an embodiment, the fan 156 may be prevented from rotating unless a threshold temperature has been reached. Still further, the decision to rotate the fan 156 may additionally, or alternatively, depend on the power source provided to the information handling system 100 such as whether the information handling system 100 is operating on power from the battery 122 or whether the power is provided to the information handling system 100 via an AC power adapter 124. Alternatively, or additionally, the activation of the fan 156 may be dependent on the system performance mode under which the information handling system 100 is operating. For example, the activation of the fan 156 may be based on whether the information handling system 100 is operating under a performance mode or a power mode. In the context of the present specification, a performance mode may be an operating mode under which the information handling system 100 prioritizes the performance of the information handling system 100 that includes prioritizing the power limits to maximize performance especially when executing program applications as the hardware processor 102 associated with content creation. In the context of the present specification, a power mode may be an operating mode under which the information handling system 100 prioritizes the power consumption by the hardware devices when, for example, the information handling system 100 is operating on power provided by the battery 122.

In an embodiment, the airflow 174 created by the movement of the ions 176 via activation of the ion emitter/collector blower 162 may be supplemented by airflow 174 created via the rotation of the fan 156. As such, in an embodiment, the rotation of the fan 156 may be reduced in speed or stopped as compared to other fans that do not operate alongside an ion emitter/collector blower 162 in other information handling systems 100. Because the movement of the ions 176 creates an airflow 174 via its operation, in some embodiments the rotation of the fan 156 may be stopped allowing the cooling of the hardware within the housing of the information handling system 100 by the ion emitter/collector blower 162 to be accomplished via the airflow 174 created by the creation of these ions 176 alone. In some embodiments where the heat of the hardware within the housing of the information handling system 100 increases, the processor 102, an embedded controller, or other hardware processor may direct a motor driver hardware 160 to drive a fan motor 158 to turn the fan 156 so that the additional airflow created by the rotation of the fan blades may increase the velocity of the airflow 174 further into the ion emitter/collector blower 162 and out of the housing of the information handling system 100. This allows the noises associated with the rotation of the fan 156 to be reduced or even eliminated during relatively cool temperatures within the housing of the information handling system 100 thereby decreasing the noise heard by the user of the information handling system 100. As a result, in an embodiment, the ion emitter/collector blower and fan cooling system 154 described herein may have a noiseless base capability of cooling the information handling system 100 with a backup cooling system via actuation of a fan motor 158 to rotate the fan blades of the fan 156 as described herein. This may further increase the user satisfaction of the information handling system 100 during operation of the information handling system 100 by decreasing fan noise heard by the user.

It is further appreciated that multiple temperature thresholds or power consumption levels of the information handling system 100 may be applied to determine the voltage applied to the ion emitter 164 thereby creating more ions 176 that are attracted to the ion collector 168. With a higher voltage applied to the ion emitter 164 and relatively more ions 176 created, the airflow 174 created by the ion emitter/collector blower 162 may increase in velocity. In an embodiment, the increase of airflow 174 may be linear with the increase in voltage applied to the ion emitter 164. It is also appreciated that other temperature thresholds (e.g., multiple temperature thresholds) or power consumption levels of the information handling system 100 may be applied that indicated if and at what speeds the fan blades of the fan 156 are to be rotated. For example, another temperature threshold or power consumption level of the information handling system 100 may indicate that a fan motor 158 is to be activated in order to initiate the rotation of the fan 156 at a first rotational speed. Further, yet another temperature threshold or power consumption level of the information handling system 100 may indicate that the rotational speed of the fan 156 is to be increased via the fan motor 158 and motor driver hardware 160 to any degree. As a consequence, the activation of the ion emitter/collector blower 162, the application of more voltage to the ion emitter 164, the activation of the fan motor 158 to drive the fan 156, and/or the indication to increase the speed of rotation of the fan 156 may all be controlled via the detected temperature and/or power consumption levels and whether those detected temperatures and/or power consumption levels have reached any of a plurality of temperature thresholds and/or power consumption thresholds.

It is appreciated that the operation of the ion emitter/collector blower 162 may be used to direct air in the opposite direction and into the housing of the fan 156 instead. In an embodiment, the ionic driving circuit 172 may swap the orientation of the electrodes to the ion emitter 164 and ion collector 168 to achieve this opposite direction of airflow 174. In an embodiment, a positive electrode of the high voltage source of the ionic driving circuit 172 may be operatively coupled to the ion collector 168 with the negative electrode of the high voltage source operatively coupled to the ion emitter 164. In this example embodiment, the ion collector 168 structures operate as an ion emitter that strips electrons from the gas molecules creating positively-charged ions 176 (e.g., cation) thereby operating, even temporarily, as the ion emitter. This allows the airflow 174 created by the shearing force of the created ions 174 to be reversed. In an embodiment, this may be done so that any dust or debris collecting within the ion emitter/collector blower 162, or housing of the information handling system 100 may be dislodged. Because the fan 156, in an embodiment, is placed above an air intake vent, any dust or debris collected via this reversed airflow 174 may be passed out of the housing of the information handling system 100 via this air intake vent. The ionic driving circuit 172 may, therefore, selectively reverse the operative connection of the electrodes to the ion emitter 164 and ion collector 168 to change the direction of airflow 174 as described in order to perform this internal cleaning process.

In an embodiment, the information handling system 100 is a tablet-type information handling system or a two-in-one information handling system 100. In some examples, a keyboard 144 is included with the keyboard 144 being a wireless or removeable keyboard that allows the user to use the information handling system 100 in either a tablet configuration or a laptop configuration. The information handling system 100 may be any information handling system that may be operated in an upright orientation, in some embodiments. In an example embodiment, the hardware processor 102 such as a CPU or other heat-generating hardware components may be placed within a display chassis instead of within the removable or wireless keyboard 144 portion of an information handling system. This places the hardware processor 102 behind the video display device 142. The hardware processor 102 or other heat-generating hardware components, in an example embodiment, may be placed vertically or at the same level or higher than the fan 156 and/or ion emitter/collector blower 162. The placement of the hardware processor 102 or other heat-generating hardware components above the fan 156 and/or ion emitter/collector blower 162 allows for the operation of the fan 156 and ion emitter/collector blower 162 to take advantage of a stack effect or chimney effect. The chimney effect, in the present specification, pulls air into the housing of the information handling system 100 via the air intake vent and fan 156 and out of the housing via an air exhaust vent due to the differences in air buoyancy between the air inside the housing of the information handling system 100 and the air outside of the information handling system 100. Thus, the chimney effect may further provide for convection-assisted airflow with either the fan 156, the ion emitter/collector blower 162, or both inactivated. Because the air within the housing of the information handling system 100 is heated due to the operation of the heat-generating hardware components, cool air is pulled into the housing and accelerated through the housing via operation of the fan 156 and/or ion emitter/collector blower 162. This increases the amount of cold air drawn into and heated air passed out of the housing of the information handling system 100 according to various embodiments herein.

The information handling system 100 can include one or more sets of machine-readable code instructions 110 that can be executed to cause the computer system to perform any one or more of the methods or computer-based functions disclosed herein. For example, machine-readable code instructions 110 may execute; via hardware processing resources, various software applications, software agents, a basic input/output system (BIOS) 112 firmware and/or software, or other aspects or components. Machine-readable code instructions 110 may execute a control system for an ion emitter/collector blower cooling system 154 to control various aspects of the fan 156 and the ion emitter/collector blower 162 with ionic driving circuit 170 of the embodiments herein. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the processor 102 or other processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the hardware processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable machine-readable code instructions to manage the power provided to the components of the information handling system 100 such as the hardware processor 102, and manage control of the fan 156, ion emitter 164, ion collector 168, ionic driving circuit 172, and other hardware components described herein. The PMU 120 may control power to one or more components including the one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to operate with the EC 103 separately or together execute machine-readable code instructions 110 of an ion emitter/collector blower and fan control system to control the ion emitter/collector blower and fan cooling system 154 with the fan 156 and ion emitter/collector blower 162 based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can include hardware processing resources executing software, including firmware embedded at a device, such as an Intel® Core class processor, ARM® brand processors, Qualcomm® Snapdragon processors, or other processors and chipsets, or other such hardware device capable of operating a relevant software environment of the information handling system. The system, device, controller, or module can also include a combination of the foregoing examples of hardware or hardware executing software. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2A:
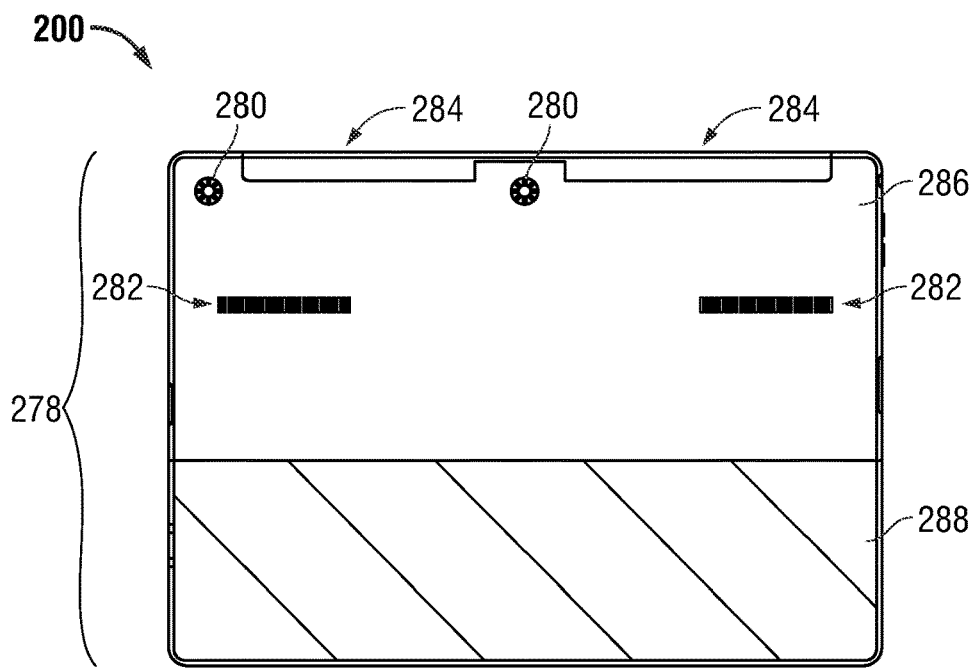
FIG. 2A is a graphic diagram rear view of an information handling system housing a cooling fan and an ion emitter/collector blower in series according to an embodiment of the present disclosure.
Figure 2B:
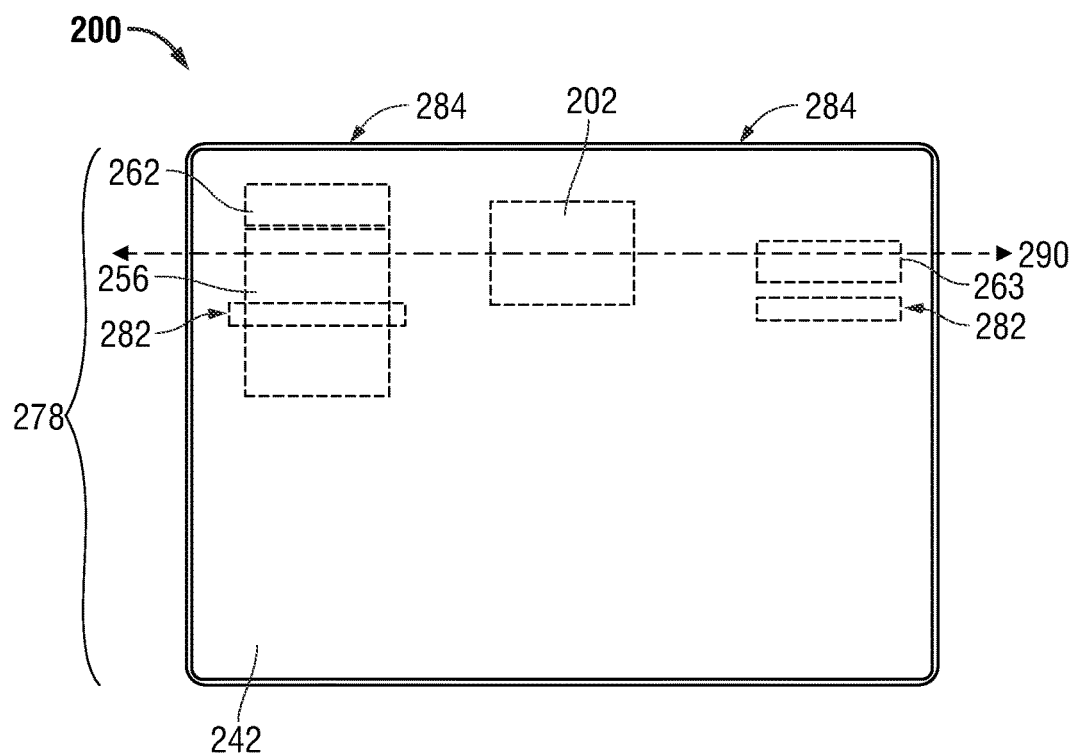
FIG. 2B is a graphic diagram top view of an information handling system housing a cooling fan and an ion emitter/collector blower in series according to another embodiment of the present disclosure.

FIG. 2A is a graphic diagram rear view of an information handling system 200 housing a fan at a fan location 256 and an ion emitter/collector blower at an ion emitter/collector blower location 262 in series according to an embodiment of the present disclosure. Additionally, FIG. 2B is a graphic diagram top view of an information handling system 200 housing a fan at a fan location 256 and an ion emitter/collector blower at an ion emitter/collector blower location 262 in series according to another embodiment of the present disclosure. The information handling system 200, as shown in FIGS. 2A and 2B may be one of a tablet information handling system or a two-in-one information handling system or other type of mobile information handling system that may operate in a vertical, near-vertical, or otherwise upright orientation in embodiments. Although the present specification describes the information handling system 200 as being a tablet-type information handling system, the present specification contemplates that the ion emitter/collector blower and fan cooling system described herein can be housed within any type of information handling system.

As described herein, the information handling system 200 may include a wireless or detachable keyboard (not shown) used by the user to provide input to the information handling system 200. In an embodiment, the video display device 242 of the information handling system 200 may be a touch display device that also or alternatively allows the user to provide input to and receive output from the information handling system 200. As described herein, the video display device 242 may serve as a cover or chassis used as a cover for the hardware devices within the display chassis 278.

As described herein, the information handling system 200 may include a display chassis 278 that includes the back cover 286 and the video display device 242 acting as a front cover. The back cover 286 and video display device 242 may be used to house a processor at the processor location 202 as well as ion emitter/collector blowers at ion emitter/collector blower locations 262 and one or more fans at a fan location 256. Other hardware components such as a battery (not shown), a memory device (not shown), a PMU (not shown) are also housed within the display chassis 278. The front cover/video display device 242, as described herein, includes a front cover/video display device 242 that serves both to cover this hardware as well as an input and output device via the touch screen video display device as described herein. The back cover 286 may also house one or more cameras 280 or other imaging device used by a user to capture still images or videos.

As described herein, the ion emitter/collector blower and fan cooling system may include one or more air intake vents 282 formed vertically at or below the fan at the fan location 256. These air intake vent 282 may allow air to be drawn into the display chassis 278 via activation of the ion emitter/collector blower as well as a cooling fan 156 may generate a cooling airflow within the information handling system 100. Air may be blown out of the display chassis 278 at one or more air exhaust vents 284 having an upper exhaust vent location in the vertically oriented information handling system 200 thereby cooling the air and heat-generating components (e.g., the hardware processor) within the display chassis 278.

As shown in FIGS. 2A and 2B, the ion emitter/collector blower and fan cooling system 254 has an ion emitter/collector blower location 262 that is above the air intake vents 282 when the information handling system 200 is in an upright orientation. In an embodiment, the fan location 256 and ion emitter/collector blower location 262 may straddle a hardware processor centerline 290 of the hardware processor at the hardware processor location 202 placing the ion emitter/collector blower location 262 vertically higher than the hardware processor centerline 290 and a majority of the fan location 256 below the hardware processor centerline 290.

In the present specification and in the appended claims, the term "vertical" is meant as an upward location where the top of the information handling system 200 is where the air exhaust vents 284 are formed into the housing when the information handling system 200 is in a vertical, near-vertical, or otherwise upright orientation. Therefore, in FIGS. 2A and 2B, the hardware processor centerline 290 is closer, vertically, to the air exhaust vents 284 while the fan is located at or below the hardware processor centerline 290. In the embodiment shown in FIGS. 2A and 2B, the ion emitter/collector blower and fan cooling system includes a fan at a fan location 256 in series with an ion emitter/collector blower at an ion emitter/collector blower location 262 on a left side of the information handling system 200. At the right side of the information handling system 200, the example information handling system 200 includes a single ion emitter/collector blower at an ion emitter/collector blower location 263. In an example embodiment, the information handling system 200 may include any number of ion emitter/collector blowers or fans. It is appreciated that, although the present specification describes a certain number of fans at a fan location 256 in series with a certain number of ion emitter/collector blowers at ion emitter/collector blower locations 263, more or fewer fans and ion emitter/collector blowers may be used to exhaust heated air from within the housing of the information handling system 200.

The air intake vents 282, in an embodiment, are placed, vertically, lower than the ion emitter/collector blower locations 262 and placed at or behind the fan location 256. The placement of the hardware processor at the fan location 256 and ion emitter/collector blower location 262 allows for the operation of the fan and ion emitter/collector blower to take advantage of a chimney effect and remove air heated around the hardware processor. The chimney effect, in the present specification, pulls air into the housing of the information handling system via the air intake vent 282, through both the fan and ion emitter/collector blower, and out of the housing via the air exhaust vents 284 due to the differences in air buoyancy between the air inside the housing of the information handling system 200 and the air outside of the information handling system 200 even without the ion emitter/collector blower or fan active. When air within the housing of the information handling system 200 is heated due to the operation of the heat-generating hardware components, cool air is pulled into the housing and accelerated through the housing via operation of the ion emitter/collector blower and fan cooling system generating the airflow which may be further enhanced based on the chimney effect. This increases the amount of cold air drawn into and heated air passed out of the housing of the information handling system 200.

As shown in FIG. 2A, the back cover 286 may include a kickstand 288 formed thereon. This kickstand 288 may allow the user to prop up the information handling system 200 on a flat surface or a lap in order to interact with the information handling system 200. The kickstand 288 can be moved to a closed orientation for the user to interact with the information handling system 200 as a tablet configuration, for example a hand-held tablet. Still further, in an embodiment where the kickstand 288 has been deployed, the user may operatively couple a detachable keyboard to the bottom edge of the information handling system 200 allowing the user to provide input to the information handling system 200.

During operation, the airflow created by the ion emitter/collector blower may be supplemented by an airflow generated by the operation of a fan. In an embodiment, the fan is placed upstream or at an air intake location 282 of the ion emitter/collector blower so that air may pass through a housing of the fan, enter the ion emitter/collector blower, and be accelerated through the housing of the ion emitter/collector blower and out of the ion emitter/collector blower at exhaust vent location 284. This series arrangement of the fan to the ion emitter/collector blower allows for the selective activation of the fan, the ion emitter/collector blower, or both based on, for example, a temperature detected within the chassis of the information handling system 200, specific hardware devices within the housing, or a combination of hardware devices within the housing of the information handling system 200. Additionally, or alternatively, the power consumed by one or more hardware devices within the information handling system 200 may indicate if and when the fan, the ion emitter/collector blower, or both are activated to create an airflow through the housing of the information handling system 200.

Figure 3:
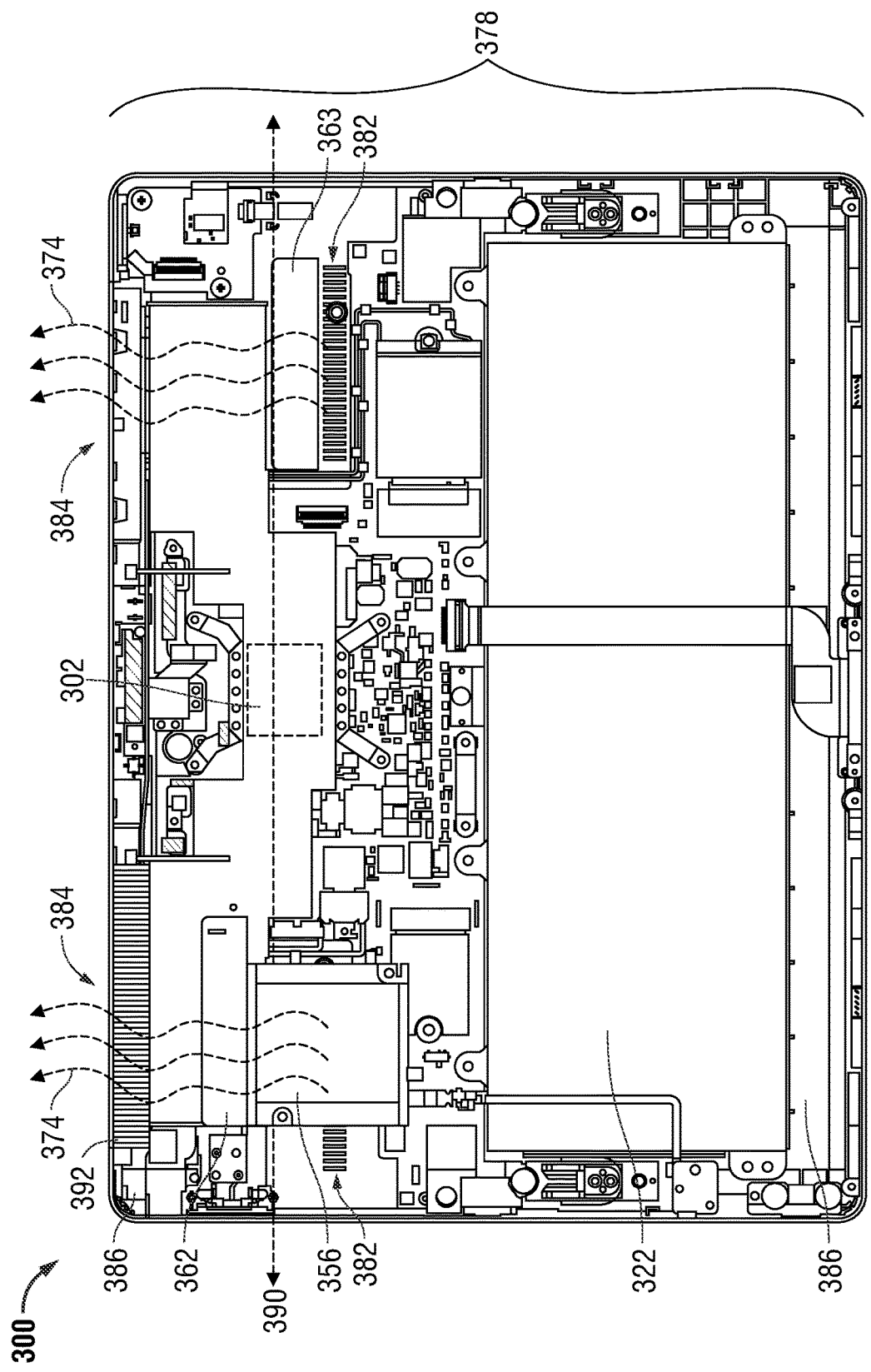
FIG. 3 is a graphic diagram front view of an interior of an information handling system including the ion emitter/collector blower and a cooling fan in series according to another embodiment of the present disclosure.

FIG. 3 is a graphic diagram front view of an interior of an information handling system including the ion emitter/collector blower 362 and a fan 356 in series according to another embodiment of the present disclosure. The information handling system 300 shown in FIG. 3 may be similar to the information handling system shown in FIG. 2B with the front cover or display (e.g., FIG. 2B, 242) removed allowing for the hardware components therein to be shown. Again, the orientation of the information handling system chassis 300 shows a tablet-type or two-in-one information handling system 300 in a vertical or upright orientation with a top of the information handling system 300 being closest to the top of the image and the bottom of the information handling system 300 being closest to the bottom of the image of FIG. 3.

As described herein, the information handling system 300 may include a wireless or detachable keyboard (not shown) used by the user to provide input to the information handling system 300. In an embodiment, this keyboard may be operatively and mechanically couplable to a side wall (e.g., bottom wall) of the tablet-type information handling system 300.

In embodiments herein, the tablet-type or two-in-one information handling system 300 may include a display chassis 378 that includes the back cover 386 and front cover/display (not shown). The back cover 386 and front cover/display may be used to house a hardware processor at the hardware processor location 302 as well as one or more ion emitter/collector blower cooling systems that are placed to straddle a hardware processor centerline 390 or may be placed elsewhere in the tablet-type information handling system 300 when in a vertical, near-vertical, or otherwise upright orientation. Other hardware components such as a battery 322, a memory device (not shown), a PMU (not shown) are also housed within the display chassis 378 of the tablet-type or two-in-one information handling system 300 in a vertical orientation. The front cover/display (not shown), as described herein, includes a front cover/display that serves both to cover this hardware as well as an input device such as the touch screen video display device as described herein. The back cover 386 may also house a camera (not shown) or other imaging device used by a user to capture still images or videos.

As described herein, the ion emitter/collector blower cooling system may include one or more air intake vent 382 formed at or behind the fan 356. FIG. 3 shows a single fan 356 placed in series with a single ion emitter/collector blower 362 on the left as well as a single ion emitter/collector blower 363 on the right. However, it is appreciated that any number of fans 356 may be placed, in series, with any number of ion emitter/collector blowers 362. The air intake vents 382 may allow air to be drawn into the display chassis 378 via activation of the fan 356, passed through the fan 356 (e.g., when fan is either activated or not) and into the ion emitter/collector blower 362 in series with the fan 356, and out of the air exhaust vents 384 formed at the top side wall of the back cover 386 of the display chassis 378. In one embodiment, the output vent of the fan 356 may be sealed against the input vent of the ion emitter/collector blower 362 so that air passing from the housing of the fan 356 may pass directly into the air intake of the ion emitter/collector blower 362. In an embodiment, the housing at the air output of the fan 356 may be similarly sized to the air intake of the ion emitter/collector blower 362.

As shown in FIG. 3, the fan 356 and ion emitter/collector blower 362 straddle a hardware processor centerline 390 or a centerline of another heat-generating hardware component in some embodiments. The hardware processor centerline 390 is closer, vertically, to the air exhaust vents 384 while the fan 356 is located generally below the hardware processor centerline 390 since the hardware processor is typically a substantial heat producing hardware component. Still further, the air intake vent 382 is behind (e.g., in a z-direction or into the page) the fan 356. The placement of the hardware processor at the hardware processor location 302 generally above fan 356 allows for the operation of the fan 356 and ion emitter/collector blower 362 to take advantage of a chimney effect to clear air heated around the location or area of hardware processor and other heat-generating devices within the display chassis 378. The chimney effect, in the present specification, pulls air into the housing of the information handling system via the air intake vents 382 and out of the housing via the air exhaust vents 384 due to the differences in air buoyancy between the air inside the housing of the information handling system 300 and the air outside of the information handling system 300 and may generate some airflow even with the ion emitter/collector blower 362, 363 or fan 356 idle. With the movement of air by the fan 356 and/or the ion emitter/collector blower 362, this increases the amount of cold air drawn into and heated air passed out of the housing of the information handling system 300 via convection.

As described herein, each of the ion emitter/collector blowers 362, 363 include an ion emitter and ion collector. In an embodiment, the ion emitters include a plurality of emitter blades through which air may pass (e.g., from a fan) and which are used to create an airflow 374 into, through, and out of the ion emitter/collector blower 362. The number of blades may vary depending on an anticipated level of heat generation by the hardware components within the information handling system 300, and the shape and design of the housing of the ion emitter/collector blower 362, the shape and design of the housing of the fan 356, or housing of the information handling system 300, among other factors. Each of the emitter blades are coupled to an electrode of a high voltage source of an ionic driving circuit (not shown). In an embodiment, each of the emitter blades includes a blade edge. In one embodiment, the blade edges may be made to come to a sharp point in order to facilitate the creation of more ions. In an embodiment, the ion emitters and the emitter blades may be made of a refractory metal such as niobium, chromium, molybdenum, tantalum, tungsten, and rhenium among others. In an embodiment, the portions of the ion emitter/collector blower 362 and emitter blades may be electroplated with a refractory metal such as niobium, chromium, molybdenum, tantalum, tungsten, and rhenium among others with an interior layer of the first ion emitter and emitter blades being made of a conductive material such as iron. It is appreciated that the emitter blades may be made of any alloy of metal that includes alloys of those refractory metals described herein.

The ion emitter/collector blowers 362 also include an ion collector. In an embodiment, the ion collector includes a plurality of collector blades through which air may pass and which are used to deionize those ions created at the ion emitters as described herein. The number of collector blades may vary depending on an anticipated level of heat generation by the hardware components within the information handling system 300, the shape and design of the housing of the ion emitter/collector blower 362, the shape and design of the housing of the ion emitter/collector blower 362, or the housing of the information handling system 300, among other factors such as the creation of ions at the first ion emitters. Each of the collector blades are coupled to an electrode of a high voltage source of an ionic driving circuit in an embodiment. In an embodiment, the collector blades are coupled to a grounding source used to prevent arcing between the ion emitter/collector blower 362. In an embodiment, each of the collector blades includes a blade edge. It is appreciated that the ion collector blades may be made of any alloy of metal that includes alloys of those refractory metals described herein.

The back cover 386 may include a kickstand (not shown) formed thereon. This kickstand may allow the user to prop up the tablet-type information handling system 300 in a vertical or near-vertical orientation on a flat surface or a lap in order to interact with the information handling system 300. The kickstand can be moved to a closed orientation for the user to interact with the information handling system 300 as a hand-held tablet configuration. Still further, in an embodiment where the kickstand has been deployed, the user may operatively couple a detachable keyboard to the bottom edge or sidewall of the information handling system 300 allowing the user to provide input to the information handling system 300. In such a laptop configuration, the air behind the information handling system 300 may be drawn into the display chassis 378, pass through the fan 356 and ion emitter/collector blower 362 placed in series, and out of the air exhaust vent 380 with convection-enhanced airflow 374. It is appreciated that the space or distance between the ion emitter/collector blower 362 and the air exhaust vents 384 may include any type of passive heat conducting device such as a fin-stack 392. In an embodiment, the fin-stack 392 may be operatively coupled to other heat conducting devices such as heat pipes or vapor chambers used to conduct heat from the hardware processor or other heat-generating devices to the fin-stack 392. Because the fin-stack 392 is in the path of the airflow 374, heat conducted into the fin-stack 392 may be dissipated into the airflow 374 via convection and passed out of the display chassis 378.

In one embodiment, a sealed channel area may be formed between the ion emitter/collector blower 362 and the air exhaust vents 384 that seal the hardware processor at the hardware processor location 302 or passive heat conducting device into the airflow 374 path. In an embodiment, the sealed channel area may be a fluidically sealed portion of the display chassis 378 or may be an additional sealing structure and sealed with the hardware processor as well as other heat-generating hardware devices in the airflow 374 within the housing of the information handling system 300. This allows heat to be directed into the airflow 374 between the ion emitter/collector blower 362 and fin-stack 392 to be pulled out of the housing of the information handling system 300. In an embodiment, the sealed channel area location may house any number of passive heat conducting devices that draw heat away from the heat-generating devices and into an airflow 374 between the ion emitter/collector blower 362 and air exhaust vent 384 acting as a fluid-to-fluid heat exchanger transferring thermal energy from the passive heat conducting devices (e.g., heatpipe, vapor chamber, fin-stack, etc.) to the air within the airflow 374.

Figure 4:
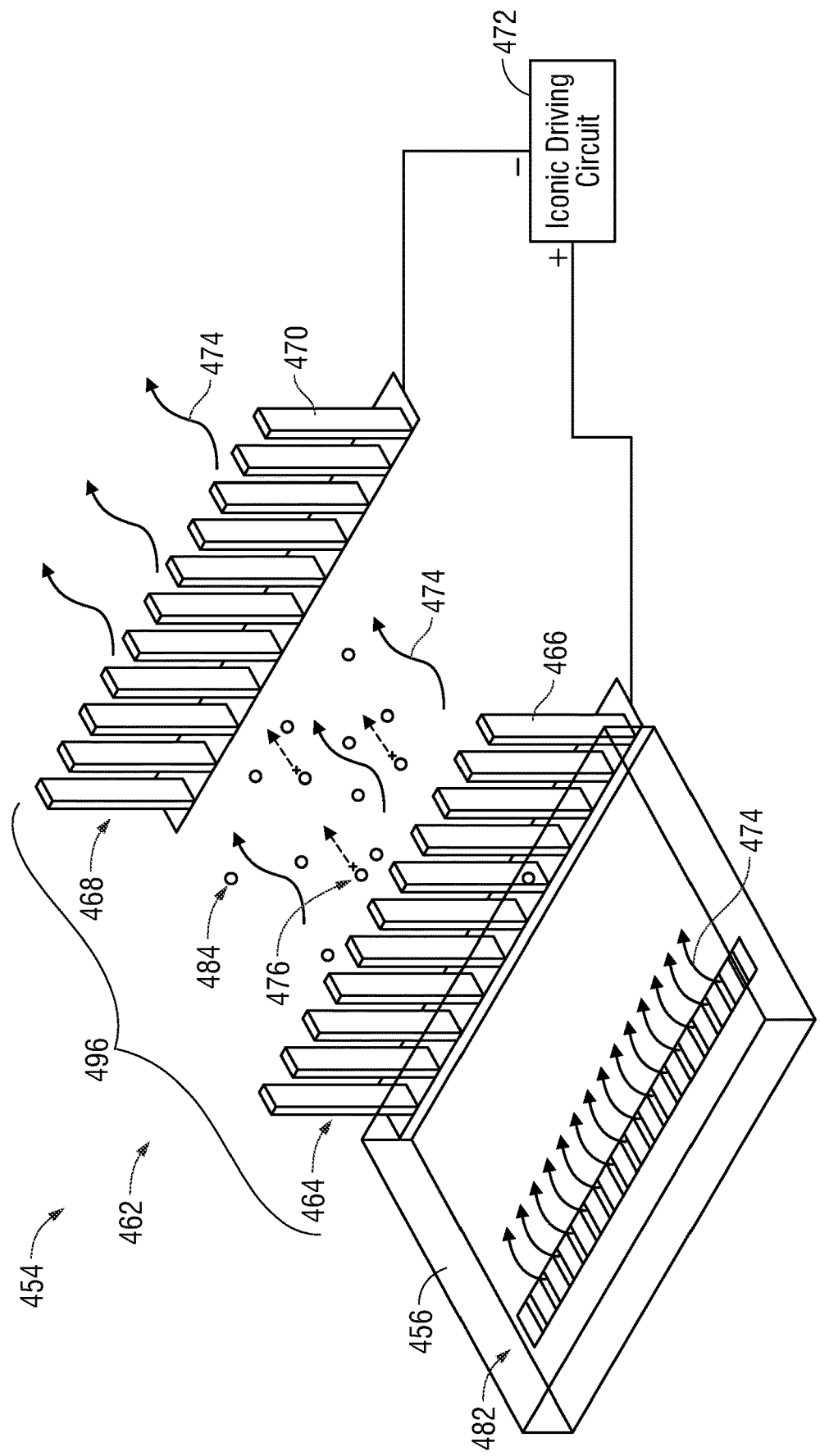
FIG. 4 is a graphic diagram perspective view of an ion emitter/collector blower including an ion emitter and ion collector as well as a cooling fan housing used to house a fan according to another embodiment of the present disclosure.

FIG. 4 is a graphic diagram perspective view of an ion emitter/collector blower and fan cooling system 454 including an ion emitter/collector blower 462 that comprises an ion emitter 464 and ion collector 468 as well as a fan housing 456 used to house a fan (fan impeller not shown) according to another embodiment of the present disclosure. The ion emitter/collector blower 462 may be coupled within a chassis of the information handling system in an embodiment so that heat generated by the operation of the hardware (e.g., hardware processor, memory devices, PMU, CPU, etc.) may be directed out of the information handling system via an air exhaust vent formed in the chassis (e.g., at a top side surface of the base chassis of the information handling system). As described herein, the arrangement of the ion emitter/collector blower 462 relative to the fan housing 456 is shown in FIG. 4 with the fan impeller within the fan housing 456 being removed to show the relative position of the air intake vent 482 to the fan housing 456 and its fan. As such, the ion emitter/collector blower 462 may be placed in series with the fan and fan housing 456 so that the velocity of the airflow 474 may be increased as it passes through the fan housing 456 and the ion emitter/collector blower 462. The ion emitter/collector blower 462 may include an ion emitter/ collector blower housing (not shown) used to house the components of the ion emitter/collector blower 462 described herein in an embodiment. However, FIG. 4 does not show the housing of the ion emitter/collector blower 462 so that the ion emitter 464 and ion collector 468 may be seen. In an alternative embodiment, the ion emitter/collector blower 462 does not include an ion emitter/collector blower housing and instead, those components of the ion emitter/collector blower are operatively coupled to the chassis of the information handling system. Again, as described herein, the fan housing 456 may be fluidically sealed to a The ion emitter/collector blower cooling system 454 includes the ion emitter/collector blower 462 with an ion emitter 464. In an embodiment, the ion emitter 464 includes a plurality of ion emitter blades 466 through which air may pass and which are used to create an airflow into, through, and out of the ion emitter/collector blower housing. The number of ion emitter blades 466 may vary depending on an anticipated level of heat generation by the hardware components within the information handling system, or the shape and design of the ion emitter/collector blower housing or chassis of the information handling system, among other factors. Each of the ion emitter blades 466 are coupled to an electrode of a high voltage source of an ionic driving circuit 472. In an embodiment, each of the ion emitter blades 466 includes a blade edge. In one embodiment, the blade edges may be made to come to a sharp point in order to facilitate the creation of more ions 476. In an embodiment, the ion emitter 464 of the ion emitter/collector blower 462 and the emitter blades 466 may be made of a refractory metal such as niobium, chromium, molybdenum, tantalum, tungsten, and rhenium among others. In an embodiment, the portions of the ion emitter/collector blower 462, ion emitter 464, and ion emitter blades 466 may be electroplated with a refractory metal such as niobium, chromium, molybdenum, tantalum, tungsten, and rhenium among others with an interior layer of ion emitter 464 and ion emitter blades 466 being made of a conductive material such as iron. It is appreciated that the ion emitter blades 466 may be made of any alloy of metal that includes alloys of those refractory metals described herein.

The ion emitter/collector blower 462 also includes an ion collector 468 with a distance 496 between the ion emitter 464 and ion collector 468 across which ions 476 may generate airflow 474. In an embodiment, the ion collector 468 includes a plurality of ion collector blades 470 through which air may pass and which are used to deionize those ions 476 created at the ion emitter 464 as described herein. The number of ion collector blades 470 may vary depending on an anticipated level of heat generation by the hardware components within the information handling system, or the shape and design of the ion emitter/collector blower housing or housing of the information handling system, among other factors such as the creation of ions 476 at the ion emitter 464. Each of the ion collector blades 470 are coupled to an electrode of a high voltage source of an ionic driving circuit 472 in an embodiment. In an embodiment, the ion collector blades 470 are coupled to a grounding source used to prevent arcing between the ion emitter 464 and ion collector 468. In an embodiment, each of the ion collector blades 470 includes a blade edge. It is appreciated that the ion collector blades 470 may be made of any alloy of metal that includes alloys of those refractory metals described herein.

As described herein, the ion emitter 464 and its ion emitter blades 466 as well as the ion collector 468 and its ion collector blades 470 are electrically coupled to a high voltage source (e.g., 2 kV to 10 kV voltage source difference between the ion emitter 464 and the ion collector 468). In an embodiment, the ionic driving circuit 472 may include a boost converter that provides, for the high voltage source of the ionic driving circuit 472, those voltages described herein to the ion emitter 464 and ion collector 468. An electric field is created across the distance 496 between the ion emitter 464 and the ion collector 468.

As described in embodiments herein, the ion collector 468 and ion emitter 464 of the ion emitter/collector blower 462 may be operatively coupled to an ionic driving circuit 464. In an embodiment, the ionic driving circuit 472 is controlled via the processor, the PMU with a hardware controller, and embedded controller, or a combination thereof. The ionic driving circuit 472, in an embodiment, includes a high voltage source that is operatively coupled to the ion emitter/collector blower 462. In an embodiment, the high voltage source may include a boost converter that steps up voltage from its input (e.g., a battery or A/C power adapter) to the output at the ion emitter/collector blower 462. The high voltage source of the ionic driving circuit 472 causes the ion emitter 464 to emit ions 476 from the blade edges of each ion emitter blade 466. In the context of the present specification, the term "emit", or "emitter" is meant to describe an action and device that, at its edges or other surfaces, creates ions 476 and, via an electromagnetic repulsion, repels those ions 476 towards an attracting, oppositely charged source such as the ion collector 468 described herein. In an embodiment, the high voltage source of the ionic driving circuit 472 causes electrons to be ripped away from certain molecules such as gas molecules in the atmosphere thereby creating ions (e.g., positively-charged ions) at the edges or other surfaces of the ion emitter blades 466. This ionization process may include the removal of one or more electrons from the outer valence shells of the individual air molecules 494 within the gas such that they become positively charged (e.g., cations) in an embodiment. In an example where the interior of the ion emitter/collector blower housing includes atmospheric air, any number of types of air molecules 494 may be subjected to this process. For example, where the gas includes oxygen ($O_2$), the ionization of oxygen may include the removal of a single electron or two electrons from the oxygen molecule. This may lead to a $O_2^+$ or $O_2^{2+}$ ion (e.g., cation) being created by the ion emitter/collector blower 462 with the ionic driving circuit 472 in an embodiment. Other gas molecules or molecules within the atmosphere within the housing of the ion emitter/collector blower 462 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$.

This ionization of the atmospheric gases within the ion emitter/collector blower 462 housing helps to create an airflow 474 within the ion emitter/collector blower 462 housing across distance 496. In an embodiment, the movement of the ions 476 from the ion emitter 464 to the ion collector 468 creates a shearing force on the air (e.g., ions 476 drag non-ionized air molecules 494 and other ions 476) within the ion emitter/collector blower 462 housing. This shearing force pulls the other air molecules 484 in the direction of the travel of the ions 476 created by the ion emitter/collector blower 462 with the electric field across distance 496 towards the ion collector 468 thereby creating this airflow 474. In an embodiment, the movement of the ions 476 (shown as positive ions indicated with a "+" sign) created and emitted from the ion emitter 464 may be from the ion emitter 464 to the ion collector 468. In an example embodiment, the ion emitter 464 may be operatively coupled to a positive electrode of the high voltage source of the ionic driving circuit 472. As a result of generating the positively charged ions 476, the charged ion emitter 464 now repels those positively charged ions 476 causing the charged ions 476 to be repelled away from the ion emitter 464, following the electric field created between the ion emitter 464 and ion collector 468 across distance 496, and attracted to the ion collector 468.

In an embodiment, the ion collector 468 is operatively coupled to a negative or opposite electrode of the high voltage source of the ionic driving circuit 472. In an embodiment, the ion collector 468 is operatively coupled to a grounding source or high voltage negative source of the ionic driving circuit 472. Whether the ion collector 468 is coupled to a negative electrode of the high voltage source or to ground of the high voltage source, the voltage difference between the ion emitter 464 and ion collector 468 as well as the distance 496 determines an electric field between the ion emitter 464 and the ion collector 468. The ions 476 created by the ion emitter 464 follow this electric field. In an embodiment where the ion collector 468 is operatively coupled to a negative electrode of the high voltage source and not ground, the ion collector 468 may be electrically insulated from the remaining portions of the ion emitter/collector blower and fan cooling system 454 and the housing of the ion emitter/collector blower 462 including the ion emitter 464. In an embodiment, this electrical isolation may be accomplished by making the ion emitter/collector blower 462 housing out of an electrically non-conductive material such as plastic. In an embodiment, the electrical isolation may be accomplished by placing an insulative gasket (not shown) between the ion collector 468 and the ion emitter/collector blower 462 housing and the ion emitter 464. The electrical isolation of the ion collector 468 allows for the electrical field between the ion emitter 464 and ion collector 468 to be formed allowing for an electrical field path for the ions 476 to follow.

In an embodiment, the creation of the electric field between the ion emitter 464 and ion collector 468 causes the positively-charged ions 476 created by the ion emitter 464 to be attracted to the negatively charged ion collector 468 further causing movement of the ions 476 and creating an airflow 474 within the ion emitter/collector blower 462 housing as described. As the positively-charged ions 476 reach the ion collector 468, those missing valence electrons stripped away by the ion emitter 464 at the ions 476 may be added to a valence shell of the ionized air molecules 494 placing those ions 476 at a neutral electrical charge again. Following the example of the ionization of the oxygen molecules in the air molecules 494 within ion emitter/collector blower 462 housing by the ion emitter 464, as these $O^+$ or $O^{2+}$ ions 476 (e.g., cations) have their extraneous electrons returned from at their valence electron shells (e.g., a single electron or two electrons, respectively) the oxygen molecules are placed in an electrically neutral state.

The creation of this airflow 474 via the ionic movement of the ions 476 created by the ion emitter 464 has a low-pressure head of around 0.04 to 0.05 inches of $H_2O$ (water column) as compared to the rotation of a fan or blower that may have a pressure head of around 0.5 inches of $H_2O$. However, the flow rate of air into and out of the ion emitter/collector blower 462 via operation of the ion emitter 464 and ion collector 468 creating ions 476 is relatively higher than the potential flow rate of air created by the rotation of a fan alone. By imparting relatively high airflow rate with lower pressure head, the acoustics of the ion emitter/collector blower and fan cooling system 454 can be reduced in an embodiment or the fan speed may be reduced for the same airflow. Further, placement of the ion emitter/collector blower and fan cooling system 454 in a chassis of an information handling system with a lower air intake vent 482 and a higher exhaust vent (not shown) proximate to the ion emitter/collector blower and fan cooling system 454, the airflow 474 may also be enhanced by convection due to a chimney effect through the information handling system chassis.

In an embodiment, the airflow 474 created by this movement of the ions 476 may supplement the airflow 474 created via the rotation of a fan formed within the fan housing 456 or activation of a blower. As such, in an embodiment, the rotation of the fan may be reduced in speed or stopped as compared to other fans that do not operate alongside an ion emitter/collector blower 462 in other information handling systems. Because the movement of the ions 476 creates an airflow 474, in some embodiments the rotation of the fan may be stopped allowing the cooling of the hardware within the housing of the information handling system by the ion emitter/collector blower 462 to be accomplished via the airflow 474 created by the creation of the ions 476 by the ion emitter 464. In some embodiments where the heat of the hardware within the housing of the information handling system increases, the hardware processor may direct motor driver hardware to drive a fan motor to turn the fan so that the additional airflow 474 created by the rotation of the fan blades to increase the speed of the airflow 474 further. This allows the noises associated with the rotation of the fan to be reduced or even eliminated during relatively cool temperatures within the housing of the information handling system thereby often decreasing the noise heard by the user of the information handling system. As a result, in an embodiment, the ion emitter/collector blower and fan cooling system 454 described herein may have a noiseless base capability of cooling the information handling system with a backup cooling system via actuation of a fan motor to rotate the fan blades as described herein. This may further increase the user satisfaction of the information handling system during operation of the information handling system by decreasing fan noise heard by the user. In an embodiment, the fan may be prevented from rotating unless a threshold temperature has been reached. Still further, the decision to rotate the fan may additionally, or alternatively, depend on the power source provided to the information handling system such as whether the information handling system is operating on power from the battery or whether the power is provided to the information handling system via an AC power adapter. Alternatively, or additionally, the activation of the fan may be dependent on the system performance mode under which the information handling system is operating. For example, the activation of the fan may be based on whether the information handling system is operating under a performance mode or a power mode.

It is appreciated that, in an embodiment, a positive electrode of the high voltage source of the ionic driving circuit 472 may be operatively coupled to the ion collector 468 structure with the negative electrode of the high voltage source operatively coupled to the ion emitter 464 structure so the airflow 474 is reversed. In this example embodiment, the ion collector 468 structure of the ion emitter/collector blower 462 may strip electrons from the air molecules 494 creating a positively-charged ions 476 (e.g., cations) whereby the ion collector 468 structure operates, even temporarily, as an ion emitter. This allows the airflow 474 created by the shearing force of the created ions 476 to be reversed in an opposite direction than that shown in FIG. 4. In an embodiment, this may be done so that any dust or debris collecting within the ion emitter/collector blower 462 housing or the base chassis of the information handling system may be dislodged. Because the fan is placed at an air intake vent 482, any dust or debris collected via this reversed airflow 474 may be passed out of the housing of the information handling system via this air intake vent 482. The ionic driving circuit 472 may, therefore, selectively reverse the operatively connection of the electrodes to the ion emitter 464 and ion collector 468 to change the direction of airflow 474 as described in order to perform this internal cleaning process.

Figure 5:
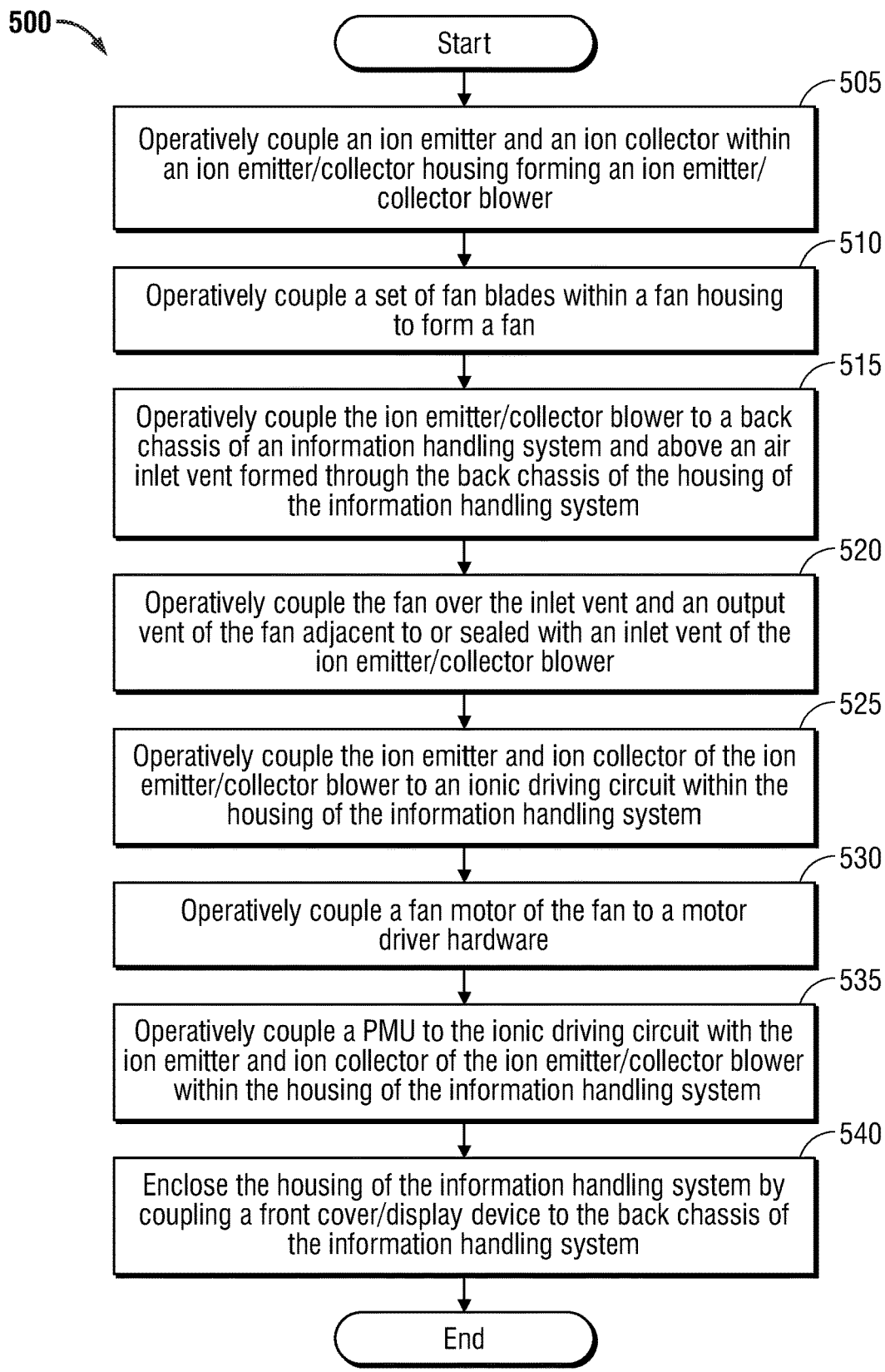
FIG. 5 is a flow diagram of a method of manufacture of an information handling system including an ion emitter/collector blower in series with a cooling fan according to an embodiment of the present disclosure.

FIG. 5 is a flow diagram of a method of manufacture of an information handling system including an ion emitter/collector blower in series with a fan according to an embodiment of the present disclosure. The method 500 includes, at block 505, operatively coupling an ion emitter and an ion collector within an ion emitter/collector housing forming an ion emitter/collector blower. As described herein, the ion emitter described herein include a plurality of emitter blades through which air may pass and which are used to create an airflow into, through, and out of the ion emitter/collector blower housing of the ion emitter/collector blower. The number of emitter blades may vary depending on an anticipated level of heat generation by the hardware components within the information handling system, or the shape and design of the ion emitter/collector blower housing or chassis of the information handling system, among other factors described herein. Each of the emitter blades, as described herein, are coupled to an electrode of a high voltage source of an ionic driving circuit during operation of the ion emitter/collector blower. In an embodiment, each of the emitter blades includes a blade edge. In one embodiment, the blade edges may be made to come to a sharp point in order to facilitate the creation of more ions during operation of the ion emitter/collector blower. In an embodiment, the ion emitter of the ion emitter/collector blower and the emitter blades may be made of a refractory metal such as niobium, chromium, molybdenum, tantalum, tungsten, and rhenium among others. In an embodiment, the portions of the ion emitter/collector blower cooling system and emitter blades may be electroplated with a refractory metal such as niobium, chromium, molybdenum, tantalum, tungsten, and rhenium among others with an interior layer of the ion emitter/collector blower cooling system and emitter blades being made of a conductive material such as iron. It is appreciated that the emitter blades may be made of any alloy of metal that includes alloys of those refractory metals described herein.

The ion emitter/collector blower cooling system also includes an ion collector with a distance between the ion emitter and ion collector across which ions may generate airflow. In an embodiment, the ion collector includes a plurality of collector blades through which air may pass and which are used to deionize those ions created at the ion emitter as described herein. The number of collector blades may vary depending on an anticipated level of heat generation by the hardware components within the information handling system, or the shape and design of the ion emitter/collector blower housing or housing of the information handling system, among other factors such as the creation of ions at the ion emitter during operation of the ion emitter/collector blower. Each of the collector blades are coupled to an electrode of a high voltage source of an ionic driving circuit in an embodiment. In an embodiment, the collector blades are coupled to a grounding source used to prevent arcing between the first ion emitter and first ion collector. In an embodiment, each of the collector blades includes a blade edge. It is appreciated that the collector blades may be made of any alloy of metal that includes alloys of those refractory metals described herein.

The method 500 includes, at block 510, operatively coupling a set of fan blades of an impeller within a fan housing to form a cooling fan. As described herein, the fan may include a fan housing that houses a series of fan blades of an impeller that are operatively coupled to a fan motor. In an embodiment the fan blades may include a plurality of blades that are formed together at a central hub. This central hub of the impeller may be operatively coupled to a shaft of the fan motor so that the rotation of the shaft will impart a rotation of the fan blades and central hub during operation of the fan described herein.

The method 500 further includes, at block 515, operatively coupling the ion emitter/collector blower to a back chassis of an information handling system and above an air inlet vent formed through the back chassis of the housing of the information handling system. In an embodiment, the ion emitter/collector blower may be placed within the back chassis of the information handling system at a location vertically above the air intake vent such that enough space is available for a fan and its fan housing to be placed over this air intake vent in the back cover. In an embodiment, the ion emitter/collector blower may be placed a distance away from a top side wall of the housing of the information handling system where one or more air exhaust vents are formed. The placement of the ion emitter/collector blower a distance from away form a top side wall allows for heat generating hardware components or other passive heat conducting devices to be placed between the ion emitter/collector blower and the air exhaust vents. In an embodiment, this placement may be in a sealed channel area of the information handling system chassis.

The method 500 further includes, at block 520, operatively couple the fan over the inlet vent and couple an output of the fan to an inlet of the ion emitter/collector blower. In some embodiments, the coupling of the fan output to the inlet of the ion emitter/collector blower may be sealed. In an embodiment, the output of the fan is sealed against the input of the ion emitter/collector blower so that air passing from the housing of the fan may pass directly into the air intake of the ion emitter/collector blower. In an embodiment, the housing at the air output of the fan may be similarly sized to the air intake of the ion emitter/collector blower. In an embodiment, the sealing of the output of the fan against the input of the ion emitter/collector blower may be conducted prior to either the ion emitter/collector blower or fan being operatively coupled to the back chassis of the information handling system.

The hardware processor of the information handling system, in an example embodiment, may be placed vertically or at the same level or higher than the fan and/or ion emitter/collector blower. The placement of the hardware processor or other heat-generating hardware component above the fan and/or ion emitter/collector blower allows for the operation of the fan and ion emitter/collector blower to clear air heated by a heat-generating hardware device in the chassis area of the processor or other heat-generating device. In one embodiment, this area of the chassis may be a sealed channel area that may focus airflow to cool the heat-generating device or any passive cooling structures within the sealed channel area. Further, location of the inlet vents, cooling fan, and ion emitter/collector blower, and outlet exhaust vents may provide for a chimney effect. The chimney effect, in the present specification, pulls air into the housing of the information handling system via the air intake vent and out of the housing via an air exhaust vent located at an upper location due to the differences in air buoyancy between the air inside the housing of the information handling system and the air outside of the information handling system for convection-assisted airflow. With the in-series fan and ion emitter/ collector blower, when the air within the housing of the information handling system is heated due to the operation of the heat-generating hardware components, cool air is pulled into the housing and accelerated through the housing via operation of the fan and ion emitter/collector blower. This increases the amount of cold air drawn into and heated air passed out of the housing of the information handling system via convection during operation of the information handling system.

The method 500 further includes, at block 525, operatively coupling the ion emitter and ion collector of the ion emitter/collector blower to an ionic driving circuit within the housing of the information handling system. As described herein, the ion emitters include a plurality of emitter blades through which air may pass and which are used to create an airflow into, through, and out of the ion emitter/collector blowers as described. Each of the emitter blades are coupled to an electrode of a high voltage source of an ionic driving circuit. In an embodiment, each of the emitter blades includes a blade edge. In one embodiment, the blade edges may be made to come to a sharp point in order to facilitate the creation of more ions during operation of the ion emitter/collector blower.

Additionally, the ion collectors include a plurality of collector blades through which air may pass and which are used to deionize those ions created at the ion emitter as described herein. Each of the collector blades are coupled to an electrode of a high voltage source of an ionic driving circuit in an embodiment. In an embodiment, the collector blades are coupled to a grounding source used to prevent arcing between the ion emitter and ion collector. In an embodiment, each of the collector blades includes a blade edge. It is appreciated that the ion collector blades may be made of any alloy of metal that includes alloys of those refractory metals described herein.

As described herein, the ion emitter and its blades as well as the ion collector and its blades are electrically coupled to a high voltage source (e.g., 2 kV to 10 kV voltage source difference between the ion emitter and the ion collector). In an embodiment, the ionic driving circuit may include a boost converter that provides, for the high voltage source of the ionic driving circuit, those voltages described herein to the ion emitter and ion collector.

The method 500 further includes, at block 530, operatively coupling a fan motor of the fan to a motor driver hardware. As described herein, a processor, an embedded controller, or other hardware processor may direct a motor driver hardware to drive the fan motor to turn the fan so that the additional airflow created by the rotation of the fan blades may increase the velocity of the airflow further into the ion emitter/collector blower and out of the housing of the information handling system during operation.

At block 535, a PMU is operatively coupled to the ionic driving circuit. The PMU may provide power to the ionic driving circuit so that the voltages necessary to create ions at the ion emitter can be provided to the ion emitter during operation of the information handling system and the ion emitter/collector blower. In an embodiment, a hardware PMU controller, a hardware processor, and/or an embedded controller may be operatively coupled to the ionic driving circuit to control the levels of voltages applied to the ion emitters and ion controllers as described herein.

The method 500 includes, at block 540, enclosing the housing of the information handling system by coupling a front cover/display device to the back chassis of the information handling system. In an embodiment, the front cover/display of the information handling system may be a touch display device that also or alternatively allows the user to provide input to the information handling system. As described herein, the information handling system includes the back cover and front cover/display and may, in an example embodiment, form a tablet-type or two-in-one information handling system. In an embodiment, the back cover and front cover/display may be used to house a processor at the processor location as well as one or more ion emitter/collector blower cooling systems at an ion emitter/collector blower cooling system location. Other hardware components such as a battery, a memory device, and a memory device are also housed within the housing of the tablet-type information handling system. The front cover/display, as described herein, includes a front cover/display that serves both to cover this hardware as well as an input and output device via the touch screen video display device as described herein. At this point, the method 700 may end.

The blocks of the flow diagrams of FIG. 5 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a hardware processor;
   a memory device;
   a power management unit (PMU) to provide power to the processor and memory device;
   a fan and fan motor operatively coupled to a motor driver hardware;
   an ion emitter/collector blower cooling system including:
      an ion emitter/collector blower, the ion emitter/collector blower including an ion emitter and an ion collector, the ion emitter/collector blower being placed at a location within a chassis of the information handling system vertically higher than the fan and between the fan and an exhaust vent formed in a top edge of the housing of the information handling system;

an ionic driving circuit operatively coupled via a high voltage to the ion emitter having a plurality of ion emitter blades through which an airflow from the fan may pass to ionize gases in the airflow at the ion emitter/collector blower to create charged ions that generate additional airflow along a voltage field to and through the ion collector;

the ion collector includes a plurality of separated collector blades through which the airflow may pass to provide a deionization source for ionized gases formed by the ion emitter, wherein a greater plurality of separated collector blades are used for heat sources expected to generate larger heat levels in the information handling system and managed by the ion emitter/collector blower; and an air intake vent located at the fan and formed in a back surface of the chassis of the information handling system so that the airflow is brought into the chassis of the information handling system via the fan, through the fan and ion emitter/collector blower, and out of the air exhaust vent.

2. The information handling system of claim 1 further comprising:
the motor driver hardware for the fan to selectively activate the fan motor to supplement the airflow from the fan to pass through the ion emitter/collector.

3. The information handling system of claim 1, wherein the separated blades of the ion collector operate as thermal fins to dissipate heat conducted from a passive heat conducting device.

4. The information handling system of claim 1 further comprising:
the ion emitter including the plurality of ion emitter blades operatively coupled to the ionic driving circuit, the ionic driving circuit including a high-voltage electrical source coupled to the plurality of ion emitter blades to strip electrons from gas molecules via the high voltage at edges of the ion emitter blades, wherein a greater plurality ion emitter blades are used for heat sources expected to generate larger heat levels in the information handling system and managed by the ion emitter/collector blower.

5. The information handling system of claim 1 further comprising:
a fin-stack formed between the ion emitter/collector blower and the exhaust vent, the fin-stack operatively coupled to one or more passive heat conductive devices to distribute heat to the fin-stack placed within the airflow created at an outlet of the ion emitter/collector blower.

6. The information handling system of claim 1, further comprising:
a kickstand formed on a lower half of the information handling system, the kickstand used to prop up the information handling system when the kickstand is deployed.

7. The information handling system of claim 1, wherein the airflow at the ion emitter/collector blower is convection-enhanced airflow through the chassis of the information handling system based on arrangement of the ion emitter below the ion collector in at least one orientation of the information handling system, and the convection-enhanced airflow may be adjusted by selective operation of the fan and the ion emitter/collector blower depending on heat levels of air heated inside of the chassis of the information handling system meeting measured temperature thresholds.

8. The information handling system of claim 1 further comprising:
a sealed channel area downstream of the ion emitter/collector blower to focus the airflow to a passive heat conducting device to dissipate heat into the airflow.

9. An ion emitter/collector blower and fan cooling system for an information handling system comprising:
a fan and fan motor operatively coupled to a motor driver hardware in a chassis of the information handling system;
an ion emitter/collector blower cooling system coupled to the fan in the chassis including:
an ion emitter/collector blower, the ion emitter/collector blower including an ion emitter and an ion collector, the ion emitter/collector blower being placed at a location within a chassis of the information handling system vertically higher than the fan and between the fan and an exhaust vent formed in a top edge of the housing of the information handling system;
an ionic driving circuit operatively coupled via a high voltage to the ion emitter having a plurality of ion emitter blades through which an airflow from the fan may pass to ionize gases in the airflow at the ion emitter/collector blower to create charged ions that generate additional airflow along a voltage field to and through the ion collector; wherein
the ion collector includes a plurality of separated collector blades through which the airflow may pass to provide a deionization source for the ionized gases formed by the ion emitter, wherein a greater plurality of separated collector blades are used for heat sources expected to generate larger heat levels in the information handling system and managed by the ion emitter/collector blower; and
an air intake vent located at the fan and formed in a back surface of the chassis of the information handling system so that the airflow is brought into the chassis of the information handling system via the fan, through the fan and ion emitter/collector blower, and out of the air exhaust vent.

10. The ion emitter/collector blower and fan cooling system of claim 9 further comprising:
the motor driver hardware for the fan to selectively activate the fan motor to supplement the airflow from the fan to pass through the ion emitter/collector based on detected temperature.

11. The ion emitter/collector blower and fan cooling system of claim 9, wherein the separated blades of the ion collector operate as thermal fins to dissipate heat conducted from a passive heat conducting device.

12. The ion emitter/collector blower and fan cooling system of claim 9 further comprising:
the ion emitter including the plurality of ion emitter blades operatively coupled to the ionic driving circuit, the ionic driving circuit including a high-voltage electrical source coupled to the ion emitter blades to strip electrons from gas molecules via the high voltage at edges of the ion emitter blades.

13. The ion emitter/collector blower and fan cooling system of claim 9 further comprising:
a fin-stack formed between the ion emitter/collector blower and the exhaust vent, the fin-stack operatively coupled to one or more passive heat conductive devices to distribute heat to the fin-stack placed within the airflow created at the ion emitter/collector blower.

14. The ion emitter/collector blower and fan cooling system of claim 9, wherein the airflow through the chassis of the information handling system may be adjusted by selective operation of the fan and the ion emitter/collector blower system.

15. The ion emitter/collector blower and fan cooling system of claim 9 further comprising:
a sealed channel area to focus the airflow to a passive heat conducting device to dissipate heat into the airflow.

16. A tablet-type information handling system comprising:
an information handling system housing including a back chassis and a display chassis, the information handling system housing to house:
a hardware processor;
a memory device;
a power management unit (PMU) to provide power to the hardware processor and memory device;
a fan and fan motor operatively coupled to a motor driver hardware;
an ion emitter/collector blower cooling system including:
an ion emitter/collector blower, the ion emitter/collector blower including an ion emitter and an ion collector, the ion emitter/collector blower being placed at a location within a chassis of the information handling system adjacent to the fan and between the fan and an exhaust vent formed in a top edge of the housing of the information handling system;
an ionic driving circuit operatively coupled via a high voltage to the ion emitter having a plurality of ion emitter blades through which an airflow from the fan may pass to ionize gases in the airflow at the ion emitter/collector blower to create charged ions that generate additional airflow along a voltage field to and through the ion collector;
the ion collector includes a plurality of separated collector blades through which the airflow may pass to provide a deionization source for the ionized gases formed by the ion emitter, wherein a greater plurality of separated collector blades are used for heat sources expected to generate larger heat levels in the information handling system and managed the ion emitter/collector blower; and
an air intake vent located at the fan and formed in a back surface of the chassis of the information handling system so that the airflow is brought into the chassis of the information handling system via the fan, through the fan and ion emitter/collector blower, and out of the air exhaust vent.

17. The tablet-type information handling system of claim 16:
motor driver hardware for the fan to selectively activate the fan motor to supplement the airflow from the fan to pass through the ion emitter/collector based on power consumed by a hardware device in the information handling system.

18. The tablet-type information handling system of claim 16:
a sealed channel area between the ion emitter/collector blower and the air exhaust vent.

19. The tablet-type information handling system of claim 16, wherein the airflow through the chassis of the information handling system may be adjusted by selective operation of the fan and ion emitter/collector blower inside of the chassis of the information handling based on selection of the tablet type information handling system operating between a power savings mode to minimize power usage and a performance mode to maximize cooling.

20. The tablet-type information handling system of claim 16:
a passive heat conducting device placed between the ion emitter/collector blower and the air exhaust vent.

* * * * *